(12) United States Patent
Lajoie et al.

(10) Patent No.: US 12,476,183 B2
(45) Date of Patent: Nov. 18, 2025

(54) PUNCH-THROUGH INTERCONNECT FEATURE TO COUPLE UPPER ELECTRODES OF CAPACITORS OF MULTI-LEVEL MEMORY ARRAYS

(71) Applicant: Intel Corporation, Santa Clara, CA (US)

(72) Inventors: Travis W. Lajoie, Forest Grove, OR (US); Juan Alzate Vinasco, Tigard, OR (US); Abhishek Anil Sharma, Portland, OR (US); Van H. Le, Beaverton, OR (US); Moshe Dolejsi, Portland, OR (US); Yu-Wen Huang, Beaverton, OR (US); Kimberly Pierce, Beaverton, OR (US); Jared Stoeger, Portland, OR (US); Shem Ogadhoh, West Linn, OR (US)

(73) Assignee: Intel Corporation, Santa Clara, CA (US)

(*) Notice: Subject to any disclaimer, the term of this patent is extended or adjusted under 35 U.S.C. 154(b) by 663 days.

(21) Appl. No.: 17/692,350

(22) Filed: Mar. 11, 2022

(65) Prior Publication Data
US 2023/0290722 A1     Sep. 14, 2023

(51) Int. Cl.
*H01L 23/522*     (2006.01)
*H01L 23/528*     (2006.01)
*H01L 23/532*     (2006.01)
*H10B 12/00*      (2023.01)

(52) U.S. Cl.
CPC ...... *H01L 23/5226* (2013.01); *H01L 23/5283* (2013.01); *H01L 23/53223* (2013.01); *H01L 23/53238* (2013.01); *H01L 23/53266* (2013.01); *H10B 12/0335* (2023.02); *H10B 12/315* (2023.02)

(58) Field of Classification Search
None
See application file for complete search history.

(56) References Cited

U.S. PATENT DOCUMENTS

2020/0035683 A1* 1/2020 Sharma ............. H10D 30/6729
2020/0373312 A1* 11/2020 Sharma ................ H10D 86/60
2021/0408021 A1* 12/2021 Young .................... H10B 53/40

\* cited by examiner

*Primary Examiner* — Steven M Page
(74) *Attorney, Agent, or Firm* — Finch & Maloney PLLC

(57) ABSTRACT

An integrated circuit (IC) includes a first memory cell and a second memory cell. The first memory cell includes (i) a first transistor and (ii) a first capacitor coupled to the first transistor, where an upper electrode of the first capacitor is coupled to a first conductive structure. The second memory cell is above the first memory cell. The second memory cell includes (i) a second transistor and (ii) a second capacitor coupled to the second transistor. An upper electrode of the second capacitor is coupled to a second conductive structure. In an example, an interconnect feature includes a continuous and monolithic body of conductive material. In an example, the continuous and monolithic body extends through the second conductive structure, and further extends through the first conductive structure. In an example, the first and second memory cells are dynamic random access memory (DRAM) memory cells.

20 Claims, 11 Drawing Sheets

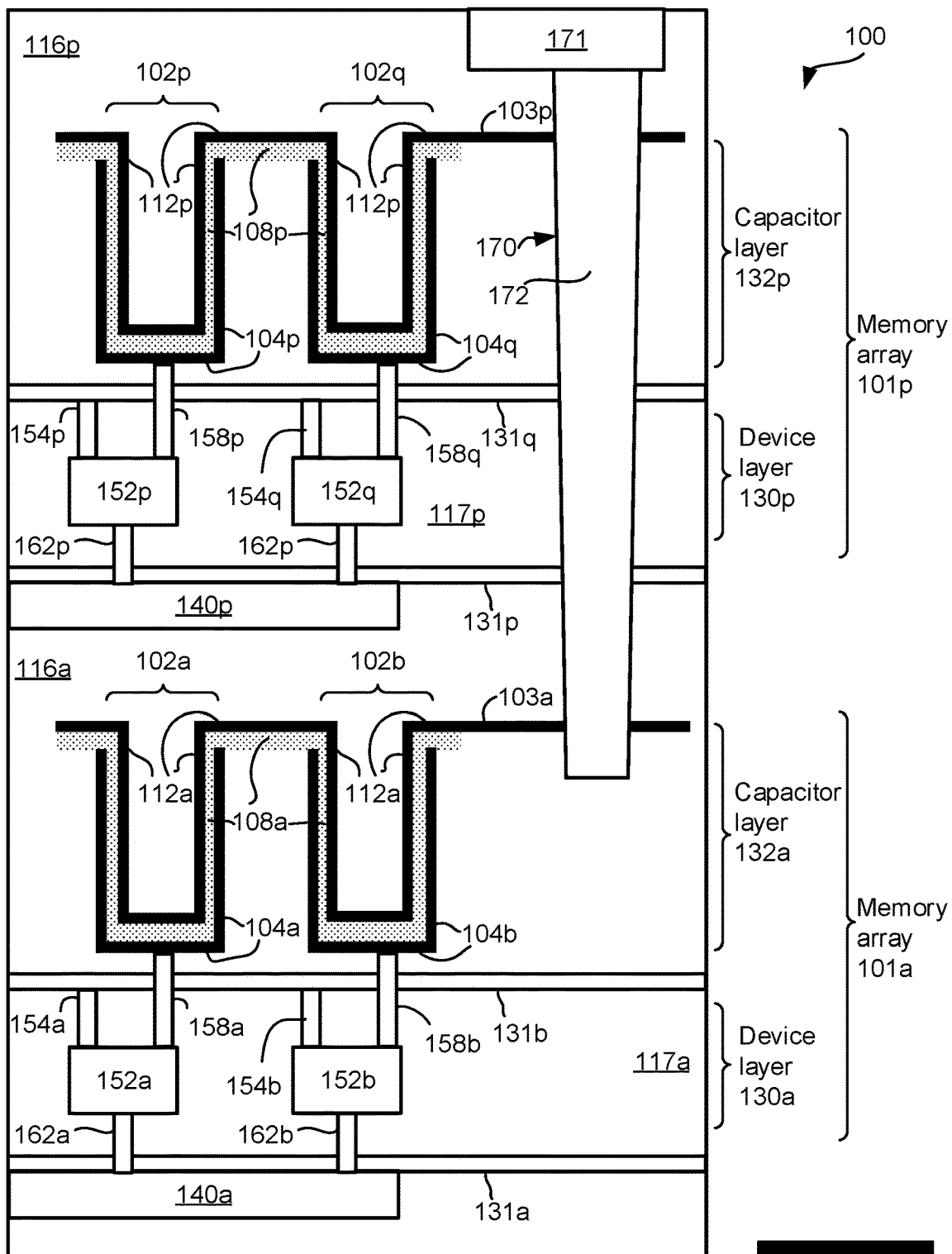
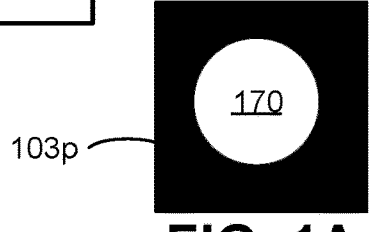
FIG. 1
FIG. 1A

PUNCH-THROUGH INTERCONNECT FEATURE TO COUPLE UPPER ELECTRODES OF CAPACITORS OF MULTI-LEVEL MEMORY ARRAYS

FIELD OF THE DISCLOSURE

The present disclosure relates to integrated circuits, and more particularly, to interconnect features for capacitors such as those used in memory arrays.

BACKGROUND

In some semiconductor memory devices, such as DRAMs (Dynamic Random Access Memory), each memory cell includes a transistor and a capacitor. For example, a memory cell uses a corresponding capacitor to store a bit of information and a corresponding transistor to access that stored bit. One cell can be connected to another cell by various interconnect features of each corresponding interconnect layer. There remain non-trivial challenges with such interconnect features.

BRIEF DESCRIPTION OF THE DRAWINGS

FIG. 1 illustrates a cross-sectional view of a section of an integrated circuit (IC) comprising (i) a first memory array and (ii) a second memory array above the first memory array, wherein individual memory cells of the first and second memory arrays comprise a corresponding transistor and a corresponding capacitor, wherein one or more capacitors of the first memory array have upper electrodes coupled to a first conductive structure, wherein one or more capacitors of the second memory array have upper electrodes coupled to a second conductive structure, and wherein an interconnect feature extends through the first conductive structure and the second conductive structure, and wherein the interconnect feature comprises a continuous and monolithic body of conductive material, in accordance with an embodiment of the present disclosure.

FIG. 1A illustrates a top or plan view of a section of the IC of FIG. 1, in which an interconnect feature is illustrated to extend through a conductive structure that is coupled to upper electrode of capacitors of a memory array, in accordance with an embodiment of the present disclosure.

Figure 2:
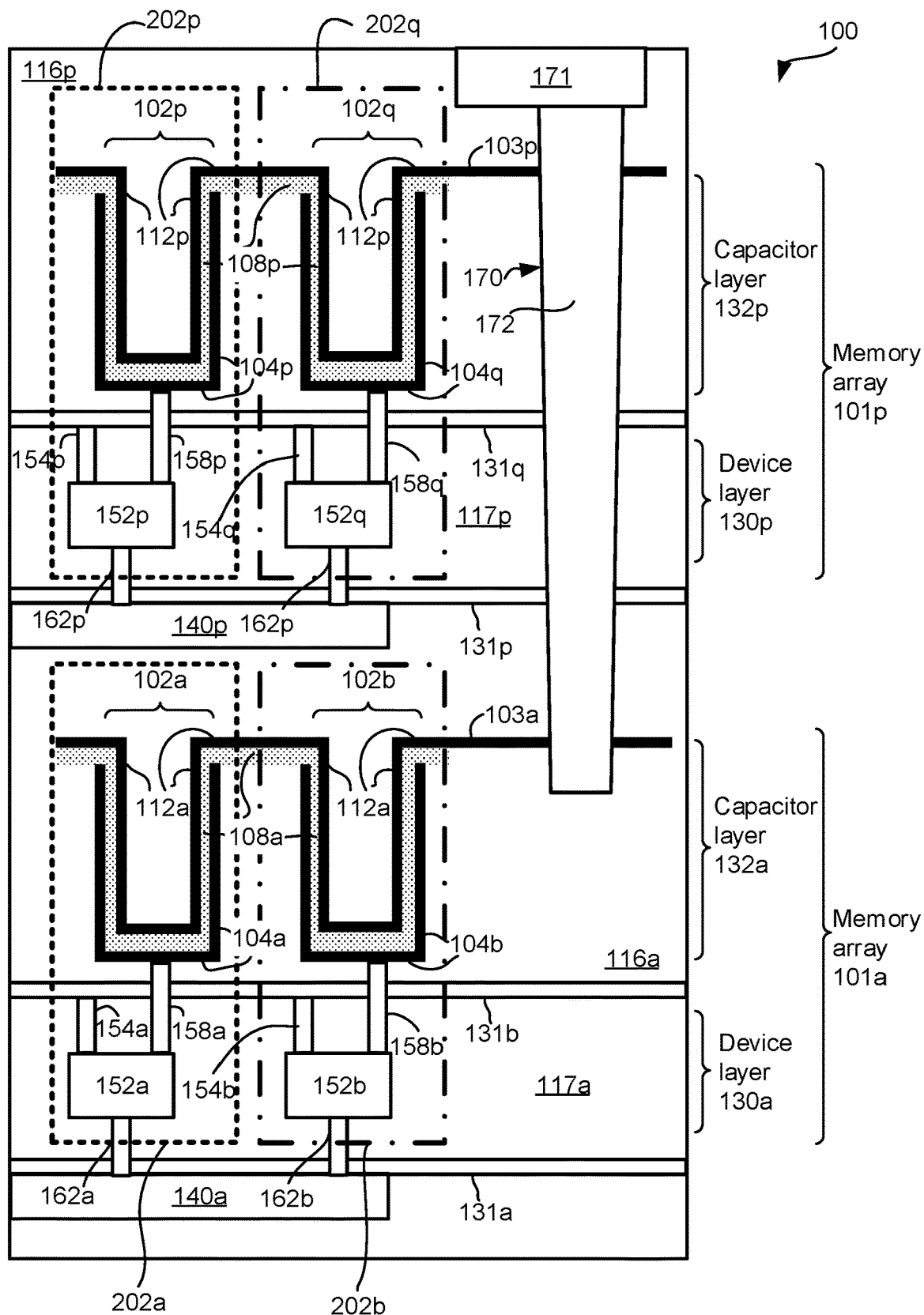
FIG. 2 illustrates a cross-sectional view of various memory cells of the first memory array and various memory cells of the second memory array of the IC of FIG. 1, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Provided herein are techniques for forming multi-level memory arrays (e.g., multi-level DRAM memory arrays), wherein each of an upper memory array and a lower memory array comprises a plurality of capacitors and a corresponding plurality of transistors, wherein electrodes of one or more capacitors of one or more memory cells of each of the lower and upper memory arrays are coupled to a corresponding conductive structure, and wherein a punch-through interconnect feature, which is formed after formation of individual memory cells, is used to interconnect one or more of such conductive structures. In one embodiment, an integrated circuit (IC) includes a first memory cell and a second memory cell. The first memory cell includes (i) a first transistor and (ii) a first capacitor coupled to the first transistor, where an upper electrode of the first capacitor is coupled to a first conductive structure. The second memory cell is above the first memory cell. The second memory cell includes (i) a second transistor and (ii) a second capacitor coupled to the second transistor. An upper electrode of the second capacitor is coupled to a second conductive structure. In an example, an interconnect feature includes a continuous and monolithic body of conductive material that extends through the second conductive structure, and further extends through the first conductive structure. In an example, the first and second memory cells are dynamic random access memory (DRAM) memory cells, although any number of memory-types can be used in conjunction with the techniques provided herein.

In another embodiment, an integrated circuit device comprises a device layer comprising a plurality of transistors, a first conductive structure coupled to a first plurality of capacitors that are above the device layer, and a second conductive structure coupled to a second plurality of capacitors that are below the device layer. In an example, the integrated circuit device further comprises an interconnect feature having a top surface above the first conductive structure. In an example, the interconnect feature extends through the second conductive structure. In an example, the interconnect feature comprises a continuous and monolithic body of conductive material extending from the top surface of the interconnect feature to the second conductive structure. In an example, the monolithic body of conductive material of the interconnect feature extends through the first conductive structure.

In yet another embodiment, an IC comprises a first layer, a second layer above the first layer, a third layer above the second layer, and a fourth layer above the third layer. In an example, the first layer comprises a first plurality of transistors. In an example, the second layer comprises a first plurality of capacitors, wherein an individual capacitor of the first plurality of capacitors is coupled to a corresponding transistor of the first plurality of transistors, and wherein an upper electrode of one or more capacitors of the first plurality of capacitors is coupled to a first conductive structure comprising conductive material. In an example, the third layer comprises a second plurality of transistors. In an example, the fourth layer comprises a second plurality of capacitors, wherein an individual capacitor of the second plurality of capacitors is coupled to a corresponding transistor of the second plurality of transistors, and wherein an upper electrode of one or more capacitors of the second plurality of capacitors is coupled to a second conductive structure comprising conductive material. In an example, a continuous and monolithic interconnect feature extends through the fourth layer, the second conductive structure, and the third layer. In an example, the interconnect feature extends through the first conductive structure. Numerous variations, embodiments, and applications will be apparent in light of the present disclosure.

General Overview

As previously noted, in some memory devices, such as DRAM memory devices, a memory cell includes a corresponding transistor and a corresponding capacitor coupled to the transistor, where the capacitor stores a bit of information and the transistor allows for writing and reading that bit. For example, the capacitor can either be charged or discharged and these two states are used to represent two possible values of 0 or 1 of a bit. One cell can be connected to another cell by various interconnect features of each corresponding interconnect layer. As also previously noted above, there remain a number of non-trivial challenges with such interconnect structures. For instance, a plurality of conductive interconnect features is formed to contact an interconnect feature of an upper interconnect layer to an electrode of one or more capacitors of a memory array in a lower interconnect layer, where the plurality of conductive interconnect features for each interconnect layer comprises one or more conductive vias and one or more conductive lines. The plurality of conductive interconnect features is patterned and formed while forming the memory cells and/or logic circuits for the memory arrays, in those same interconnect layers. To this end, the interconnect forming process further complicates the processing of each memory/logic layer. Thus, there remain significant process challenges for the patterning and formation of interconnect features, such as those for accessing capacitor electrodes of one or more memory arrays.

Accordingly, techniques are provided herein to form interconnect features for accessing electrodes of capacitors of memory arrays. The interconnect features for accessing electrodes of capacitors of memory arrays are formed subsequent to formation of the memory cells and/or the associated logic circuits, thereby effectively simplifying the formation process of the interconnect features. In particular, a multi-level interconnect feature can be formed that is continuous and monolithic in nature, rather than be comprised of multiple distinct interconnect features such as vias and lines. For example, instead of forming a plurality of interconnect features comprising multiple conductive vias and lines, a single multi-level interconnect feature is formed that is continuous and monolithic in nature, to access the capacitor electrodes of one or more memory cells of one or more memory array. In an example, the interconnect feature comprises a single conductive via having a relatively high height to width aspect ratio, such as an aspect ratio of greater than 7, or 8, or 10, or 12. In an example, the interconnect feature can access capacitor electrodes of one or more memory cells of a single memory array (e.g., within a single layer) or of multiple memory arrays (e.g., a multi-layer memory array that is within multiple layers).

In an example, a multi-level memory array comprises at least (i) a lower memory array and (ii) an upper memory array above the lower memory array, although the multi-level memory array can include more than two memory arrays. Each of the upper and lower memory arrays includes a corresponding plurality of memory cells, where each memory cell includes a corresponding capacitor and a corresponding transistor. Thus, the upper memory array comprises a corresponding plurality of capacitors, and the lower memory array comprises a corresponding plurality of capacitors. In an example, individual capacitors are MIM capacitors, with one or more dielectric material (such as oxides of metal) between an upper electrode and a lower electrode. In an example, upper electrodes of one or more capacitors of the upper memory array are coupled to an upper conductive structure. Similarly, upper electrodes of one or more capacitors of the lower memory array are coupled to a lower conductive structure.

In one embodiment, an interconnect feature couples one or both the upper and lower conductive structures to outside logic circuits. In some examples, the interconnect feature extends through the upper conductive structure, and also extends through the lower conductive structure. Thus, the interconnect feature is in contact with, and conductively coupled to, both the upper conductive structure and the lower conductive structure. Accordingly, the interconnect feature couples the upper electrodes of one or more capacitors of one or more memory cells of the upper memory array, and also the upper electrodes of one or more capacitors of one or more memory cells of the lower memory array, to outside logic circuits.

In an example, the interconnect feature is formed subsequent to formation of the memory cells of the lower and/or upper memory arrays, and/or the associated logic circuits. For example, a recess is formed that punches through the upper conductive structure and also punches through the lower conductive structure. The recess is then optionally lined with a liner or barrier layer on the sidewalls and bottom surface, and then conductive material is deposited within the recess, to form the interconnect feature. The conductive material of the interconnect feature is deposited during a single deposition process, and hence, the interconnect feature comprises a continuous and monolithic body of conductive material. Note that relatively small number of masks (e.g., one mask) is used to form the recess for the interconnect feature, which is used for both the lower and upper conductive structures. In an example, the interconnect feature is a conductive via extending through the upper conductive structure and extending through the lower conductive structure. As the interconnect feature punches through the upper conductive structure, the interconnect feature is also referred to herein as a punch-through interconnect feature. The interconnect is in contact with the upper and lower conductive structures, i.e., conductively coupled to the upper electrodes of one or more capacitors of one or more memory cells of the upper memory array, and also conductively coupled to the upper electrodes of one or more capacitors of one or more memory cells of the lower memory array. The interconnect feature conductively couples the upper and lower conductive structures to outside logic circuits.

In some examples, instead of a single interconnect feature for both the upper and lower conductive structures discussed herein above, a first interconnect feature may couple the upper conductive structure to outside logic circuits, and a second interconnect feature may couple the lower conductive structure to outside logic circuits. Thus, each of the upper and lower conductive structures have its corresponding interconnect feature. As discussed, the first and second interconnect features are formed subsequent to formation of the memory cells and the associated logic circuits.

Note that in some examples, the memory device may include more than two stacked memory arrays, such as an upper memory array, a middle memory array, and a lower memory array. The teachings of this disclosure may also be applicable for interconnect feature for upper electrodes of capacitors of three or more such stacked memory arrays. For example, similar to the above discussed upper and lower conductive structures for upper electrodes of capacitors of the upper and lower memory arrays, the middle memory array also includes a middle conductive structure for upper electrodes of one or more capacitors of one or more memory cells of the middle memory array. In some examples, the previously discussed interconnect feature, comprising the continuous and monolithic body of conductive material, extends through the upper conductive structure, extends through the middle conductive structure, and extends through the lower conductive structure. Thus, the single interconnect feature is used to couple the upper, middle, and lower conductive structures to outside logic circuits.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect a interconnect feature comprising a continuous and monolithic body of conductive material, where the continuous and monolithic body (i) extends through an upper conductive structure and (ii) extends through a lower conductive structure, where the upper conductive structure is coupled to upper electrodes of one or more capacitors of one or more memory cells of an upper memory array, and where the lower conductive structure is coupled to upper electrodes of one or more capacitors of one or more memory cells of a lower memory array that is below the upper memory array. Numerous configurations and variations will be apparent in light of this disclosure.

Architecture and Methodology

FIG. 1 illustrates a cross-sectional view of a section of an integrated circuit (IC) 100 comprising (i) a first memory array 101a and (ii) a second memory array 101p above the first memory array 101a, wherein individual memory cells 202 (see FIG. 2) of the first and second memory arrays 101a, 101p comprise a corresponding transistor and a corresponding capacitor, wherein one or more capacitors 102a, 102b of the first memory array 101a have upper electrodes 112a coupled to a first conductive structure 103a, wherein one or more capacitors 102p, 102q of the second memory array 101p have upper electrodes 112p coupled to a second conductive structure 103p, and wherein an interconnect feature 170 extends through the first conductive structure 103a and the second conductive structure 103p, and wherein the interconnect feature 170 comprises a continuous and monolithic body of conductive material, in accordance with an embodiment of the present disclosure. FIG. 2 illustrates a cross-sectional view of various memory cells 202a, 202b of the first memory array 101a and various memory cells 202p, 202q of the second memory array 101p of the IC 100 of FIG. 1, in accordance with an embodiment of the present disclosure. The IC 100 of FIG. 2 is same as the IC 100 of FIG. 1, and the labeling of the memory cells (as shown in FIG. 2) is not illustrated in FIG. 1, so as to not obfuscate the various components of the IC 100 illustrated in FIG. 1.

Referring to FIGS. 1 and 2, although the IC 100 is illustrated to include two levels of memory arrays 101a, 101p, the IC 100 may include more than two levels of memory arrays, such as three, four, or a higher number of levels of memory arrays, as will be appreciated in light of this disclosure. Although each memory array 101 is illustrated to include two memory cells, each memory cells can include more than two memory cells, as will be appreciated in light of this disclosure.

In an example, individual memory cells 202a, 202b, 202p, 202q are DRAM memory cells, such as embedded DRAM (eDRAM) memory cells. For example, each of the memory cells 202a, 202b, 202p, 202q includes a corresponding capacitor 102 and a corresponding transistor 152. Thus, a capacitor 102 and a corresponding transistor 152 form, or are otherwise part of, a corresponding memory cell 202. For example, the memory cell 202a includes a corresponding capacitor 102a and a corresponding transistor 152a, the memory cell 202b includes a corresponding capacitor 102b and a corresponding transistor 152b, the memory cell 202p includes a corresponding capacitor 102p and a corresponding transistor 152p, the memory cell 202q includes a corresponding capacitor 102q and a corresponding transistor 152q.

In a memory cell, such as the memory cell 202a for example, the capacitor 102a stores a bit of information and the transistor 152a allows for writing and reading that bit. For example, the capacitor 102a can either be charged or discharged and these two states are used to represent two possible values of 0 or 1 of a bit. In the case of some memory cells, such as DRAM cells, the electric charge on the capacitor 102a gradually leaks, which results in loss of the charge in the capacitor. To prevent this, a DRAM memory cell 202a is periodically refreshed, which involves periodically rewriting the data in the capacitor 102a, to restore the capacitor to an appropriate charge.

For purposes of simplicity, some examples and embodiments discussed herein in this disclosure refers to one specific memory cell, such as the memory cell 202a, and the teachings are applicable to other memory cells as well, such as memory cells 202b, 202p, and 202q. Similarly, for purposes of simplicity, some examples and embodiments discussed herein in this disclosure refers to one specific memory array, such as the memory array 101a, and the teachings are applicable to other memory arrays as well, such as memory array 101p.

As illustrated in FIG. 1, the capacitor 102a comprises an electrode 104a, and similarly, the capacitors 102b, 102p, and 102q comprise corresponding electrodes 104b, 104p, and 104q, respectively. As also illustrated in FIGS. 1 and 2, the capacitors 102a and 102b of the memory array 101a comprise a common electrode 112a, and the capacitors 102p and 102q of the memory array 101p comprise a common electrode 112p. Thus, the electrode 112a is common to both the capacitors 102a, 102b of the memory array 101a. Similarly, the electrode 112p is common to both the capacitors 102p, 102p of the memory array 101p.

For example, a first section of the electrode 112a is within the capacitor 102a, and a second section of the electrode 112a is within the capacitor 102b, and the first and second sections of the electrode 112a are conjoined or conductively coupled. Similarly, a first section of the electrode 112p is within the capacitor 102p, and a second section of the electrode 112p is within the capacitor 102q, and the first and second sections of the electrode 112p are conjoined or conductively coupled. In an example where there are more than two memory cells 202a, 202b within the memory array 101a, the electrode 112a may be common to more than two memory cells.

In each capacitor 102, the electrode 112 is above the corresponding electrode 104. Accordingly, the electrodes 104a, 104b, 104p, and 104q are also referred to herein as lower electrodes of the capacitors 102a, 102b, 102p, and 102qm respectively, due to their positions relative to the electrode 112. The electrodes 112a, 112p are referred to herein as upper electrodes, due to their position relative to the corresponding electrodes 104a, 104b, 104p, 104q.

In the example of FIG. 1, each of the lower electrodes 104 of the various capacitors has a shape that resembles the letter "U," e.g., has a cup-like shape. However, in other examples, the lower electrodes 104 can have another appropriate shape.

The upper electrodes 112a of the two capacitors 102a, 102b are conjoined and conductively coupled, to form a common upper electrode for the memory cells 202a, 202b of the memory array 101a. For example, a section of the upper electrode 112a within the capacitor 102a has an "U" shape, and another section of the upper electrode 112a within the capacitor 102b also has the "U" shape, and the upper electrode 112a further comprises a section that conjoins and conductively couples the two U-shaped sections. The upper electrode 112p of the two capacitors 102p, 102q also has similar configuration.

In one embodiment, the upper electrode 112a of the memory array 101a is conjoined with and conductively coupled to a conductive structure 103a, and the upper electrode 112p is conjoined with and conductively coupled to a conductive structure 103p of the memory array 101p. In an example, the conductive structure 103a may be an extension of the upper electrode 112a. In another example, the conductive structure 103a may be separate from and conductively coupled to the upper electrode 112a. Similarly, the conductive structure 103p may be an extension of the upper electrode 112p. In another example, the conductive structure 103p may be separate from and conductively coupled to the upper electrode 112p.

In one embodiment, the electrodes 104a, 104b, 104p, 104q, 112a, and/or 112b may include any suitable electrically conductive material, such as a metal or metal alloy material including, e.g., copper, silver, aluminum, tantalum (Ta), aluminum (Al), tungsten (W), nickel (Ni), platinum (Pt), molybdenum (Mo), manganese (Mn), or an alloy thereof, such as titanium nitride (TiN), tantalum nitride (TaN), titanium aluminum nitride (TiAlN), molybdenum oxide ($MoO_2$), manganese oxide ($MnO_2$), tungsten oxide ($WO_2$), or another appropriate conductive material.

In one embodiment, one more both the electrodes 104a, 104b, 104p, 104q may include a multilayer structure including two or more material layers, for example. In some embodiments, one or both the electrodes 112a, 112b may include a multilayer structure including two or more material layers, for example. In one embodiment, the electrodes 104a, 104b, 104p, 104q, 112a, and/or 112b may have any suitable thickness, such as a thickness in the range of 10 to 500 nm (e.g., 50 to 300 nm), or any other suitable range, as will be appreciated in light of this disclosure.

In one embodiment, the capacitors 102a, 102b are embedded within an Interlayer Dielectric (ILD) material 116a. Similarly, in one embodiment, the capacitors 102p, 102q are embedded within an ILD material 116p. The ILD 116a, 116p may be an appropriate dielectric material, such as a low-K dielectric material, silicon dioxide, or another appropriate dielectric material.

In one embodiment, one or more layers 108a is between the upper electrode 112a and the lower electrodes 104a, 104b of the memory array 101a. The layers 108a are present between the electrodes 104a and 112a, and also between the electrodes 104b and 112a. For example, a section of the layers 108a within the capacitor 102a (e.g., between the electrodes 104a and 112a) has an "U" shape, and another section of the layers 108a within the capacitor 102b (e.g., between the electrodes 104b and 112a) also has the "U" shape, and the layers 108a further comprises a section that conjoins and couples the two U-shaped sections of the two capacitors 102a, 102b. This results in continuous presence of the layers 108a between the capacitors 102a, 102b. That is, there is no discontinuity between a section of the layers 108a within the capacitor 102a and another section of the layers 108a within the capacitor 102b. Similarly, one or more layers 108p is between the upper electrode 112p and the lower electrodes 104p, 104q, where the one or more layers 108p may have similar configuration as the one or more layers 108a.

Note that although FIG. 1 illustrates the layers 108a within the two capacitors 102a, 102b to be continuous, the layers 108a within the two capacitors 102a, 102b may not be continuous. For example, although not illustrated in FIG. 1, there may be a discontinuity between a first section of the one or more layers 108a of the capacitor 102a and a second section of the one or more layers 108a of the capacitor 102b. Similarly, there may be a discontinuity between a first section of the one or more layers 108p of the capacitor 102p and a second section of the one or more layers 108p of the capacitor 102b.

The layers 108a form the "I" part of the MIM (metal-insulator-metal) capacitors 102a, 102b, and similarly, the layers 108p form the "I" part of the MIM capacitors 102p, 102q. Although not illustrated in FIG. 1, the layers 108a may comprise one or more distinct and/or compositionally different layers of dielectric material, and similarly, the layers 108p may comprise one or more distinct and/or compositionally different layers of dielectric material or insulating material. For example, each of the layers 108a, 108p comprise corresponding one or more thin films of one or more metal oxides. For example, each of the layers 108a, 108p can include one or more layers of metal oxides, such as one or more oxides of hafnium (Hf), aluminum (Al), zirconium (Zr), titanium (Ti), tantalum (Ta), or another appropriate metal. Merely as an example, one or both the layers 108a or 108p comprise a stack including a first layer of titanium oxide, a second layer of zirconium oxide, and a third layer of titanium oxide. In another example, one or both the layers 108a or 108p comprise a stack including a first layer of aluminum oxide, a second layer of hafnium oxide, and a third layer of aluminum oxide. Other combinations may also be possible.

In one embodiment, each of the layers 108a, 108p are conformal layers, e.g., deposited conformally. In an example, each of the layers 108a, 108p has a thickness in the range of 2-300 nm (e.g., 6-120 nm), although other thickness range may also be possible.

FIG. 1 illustrates specific structures of the capacitors 102, e.g., in which the electrodes have an "U" shape. However, in other examples, the capacitors 102 can have another appropriate structure or shape. Merely as an example, double-walled type capacitors, or pillar type capacitors can be used, instead of (or in addition to) the "U" shaped capacitors illustrated in FIG. 1, as will be appreciated in view of this disclosure.

As discussed, each of the memory cells 202 comprise a corresponding capacitor 102 and a corresponding transistor 152. In FIG. 1, the internal structures of individual transistors 152a, 152b, 152p, 152q are not illustrated, and the transistors 152a, 152b, 152p, 152q are illustrated symbolically as a black box. In an example, the transistors 152 are in a gate-bottom configuration, where the source and drain terminals are above the transistor, and the gate terminal is below the transistor.

Each transistor 152 comprises a source contact 154 coupled to a corresponding bit line (not illustrated) of the corresponding memory cell, and a drain contact 158 coupled to the corresponding lower electrode 104 of the corresponding capacitor 102. For example, transistor 152a comprises a source contact 154a coupled to a corresponding bit line (not illustrated) of the memory cell 202a, and a drain contact 158a coupled to the lower electrode 104a of the corresponding capacitor 102a. Similarly, transistor 152b comprises a source contact 154b coupled to a corresponding bit line (not illustrated) of the memory cell 202b, and a drain contact 158b coupled to the lower electrode 104b of the corresponding capacitor 102b. The transistors 152p and 152q may have similar connections for the source and drain contacts.

In one embodiment, the transistor 152a comprises a gate contact 162a coupled to a word line 140a, and the transistor 152b comprises a gate contact 162b coupled to the word line 140a. Thus, the word line 140a is common for the memory cells 202a, 202b. Similarly, in one embodiment, the transistor 152p comprises a gate contact 162p coupled to a word line 140p, and the transistor 152q comprises a gate contact 162q coupled to the word line 140p.

In an example, the transistors 152a, 152b are formed within an ILD 117a, and the transistors 152p, 152q are formed within an ILD 117p. The ILDs 117a, 117p, 116a, 116p may be compositionally the same, or may be compositionally different.

In an example, an etch stop layer 131a is below the ILD 117a, an etch stop layer 131b is below the ILD 117a and the ILD 116a, an etch stop layer 131p is between the ILD 116a and the ILD 117p, and an etch stop layer 131q is between the ILD 117p and the ILD 116p. Each etch stop layers 131a, 131b, 131p, 131q act to stop an etch process, when the etch process is used to form a trench or recess within an ILD above the etch stop layer, as will be appreciated in light of this disclosure.

In an example, the ILD 117a and the transistors 152a, 152b therewithin form a device layer 130a of the memory array 101a. Similarly, in an example, the ILD 117p and the transistors 152p, 152q therewithin form a device layer 130p of the memory array 101p. Thus, the device layer 130a comprises the plurality of transistors 152a, 152b, where individual and adjacent transistors within the device layer 130a are laterally separated by the ILD 117a. Similarly, the device layer 130p comprises a plurality of transistors 152p, 152q, where individual and adjacent transistors within the device layer 130p are laterally separated by the ILD 117p.

In an example, the ILD 116a and the capacitors 102a, 102b therewithin form a capacitor layer 132a of the memory array 101a. Similarly, in an example, the ILD 116p and the capacitors 102p, 102q therewithin form a capacitor layer 132p of the memory array 101p. Thus, the capacitor layer 132a comprises the plurality of capacitors 102a, 102b, where individual and adjacent capacitors within the capacitor layer 132a are laterally separated by the ILD 116a. Similarly, the capacitor layer 132p comprises the plurality of capacitors 102p, 102q, where individual and adjacent capacitors within the capacitor layer 132p are laterally separated by the ILD 116p.

Thus, the memory array 101a comprises (i) the device layer 130a including the plurality of transistors 152a, 152b and (ii) the capacitor layer 132a including the plurality of capacitors 102a, 102b. Similarly, the memory array 101p comprises (i) the device layer 130p including the plurality of transistors 152p, 152q and (ii) the capacitor layer 132p including the plurality of capacitors 102p, 102q.

As previously discussed herein, in each capacitor layer 132, upper electrodes 112 of one or more of the capacitors 102 of the capacitor layer 132 are conductively coupled to the corresponding conductive structure 103. For example, in the capacitor layer 132a, upper electrodes 112a of the capacitors 102a, 102b of the capacitor layer 132a are conductively coupled to the corresponding conductive structure 103a. Similarly, in the capacitor layer 132p, upper electrodes 112p of the capacitors 102p, 102q of the capacitor layer 132p are conductively coupled to the corresponding conductive structure 103p. The conductive structure 103a is within (e.g., as illustrated in FIG. 1) or above the corresponding capacitor layer 132a. The conductive structure 103p is within (e.g., as illustrated in FIG. 1) or above the corresponding capacitor layer 132p.

In one embodiment, the IC 100 further comprises a multi-level interconnect feature 170 that has a top surface above the capacitor layer 132p. In one embodiment, the multi-level interconnect feature 170 vertically extends from above the capacitor layer 132p, extends through the conductive structure 103p, and extends through the conductive structure 103a. In the example of FIG. 1, the interconnect feature 170 extends through the conductive structure 103a. Thus, the interconnect feature 170 extends within more than one level of memory arrays, in an example, and is a multi-level interconnect feature. As illustrated, a bottom surface of the interconnect feature 170 is below a bottom surface of the conductive structure 103a. The bottom surface of the interconnect feature 170 may be within the ILD 116a, as illustrated in FIG. 1. In another example and although not illustrated in FIG. 1, the bottom surface of the interconnect feature 170 may be within the ILD 117a, and in such an example, the interconnect feature 170 may extend through the etch stop layer 131b and extend within the ILD 117a. In an example, the height of the interconnect feature 170 is such that the bottom surface of the interconnect feature 170 extends to an arbitrary depth below the bottom surface of the conductive structure 103a. In an example, the depth of the interconnect feature 170 below the bottom surface of the conductive structure 103a is based on an etch process employed to form a recess for the interconnect feature 170.

FIG. 1A illustrates a top or plan view of a section of the IC 100 of FIG. 1, in which the interconnect feature 170 is illustrated to extend through the conductive structure 103p that is coupled to upper electrode 112a of the capacitors 102p, 102q of the memory array 101p, in accordance with an embodiment of the present disclosure. As illustrated in FIGS. 1 and 1A, the interconnect feature 170 extends through a hole or recess within the conductive structure 103p. The interconnect feature 170 makes contact with, and is conductively coupled to, the conductive structure 103p. In an example, the interconnect feature 170 similarly extends through a hole or recess within the conductive structure 103a and makes contact with, and is conductively coupled to, the conductive structure 103a. In an example, the interconnect feature 170 is a vertical conductive via conductively coupled to the conductive structures 103a, 103p. A top surface of the interconnect feature 170 is coupled to another interconnect feature 171, where the interconnect feature 171 is conductively coupled to logic circuits (or a ground terminal) that control the upper electrodes of the capacitors 102 of the memory arrays 101a, 101p.

In an example, the interconnect feature 170 comprises conductive material 172, such as pure copper, ruthenium, molybdenum, tungsten, aluminum, an alloy such as copper-tin (CuSn), copper indium (CuIn), copper-antimony (CuSb), copper-bismuth (CuBi), copper-rhenium (CuRe), and/or any other suitable conductive material.

In an example, the interconnect feature 170 is formed by a single deposition process of the conductive material 172. Accordingly, the interconnect feature 170 comprises a continuous and monolithic body of conductive material 172 that extends from a top surface of the interconnect feature 170 to a bottom surface of the interconnect feature 170. In an example, the continuous and monolithic body of conductive material 172 of the interconnect feature 170 extends through the conductive structure 103p to the conductive structure 103a. For example, there is no seam, interface, or liner or barrier layer between a section of the interconnect feature 170 in contact with the conductive structure 103p and another section of the interconnect feature 170 in contact with the conductive structure 103a. Rather, the entire body of conductive material 172 of the interconnect feature 170 is continuous and monolithic, in one example.

Figure 3:
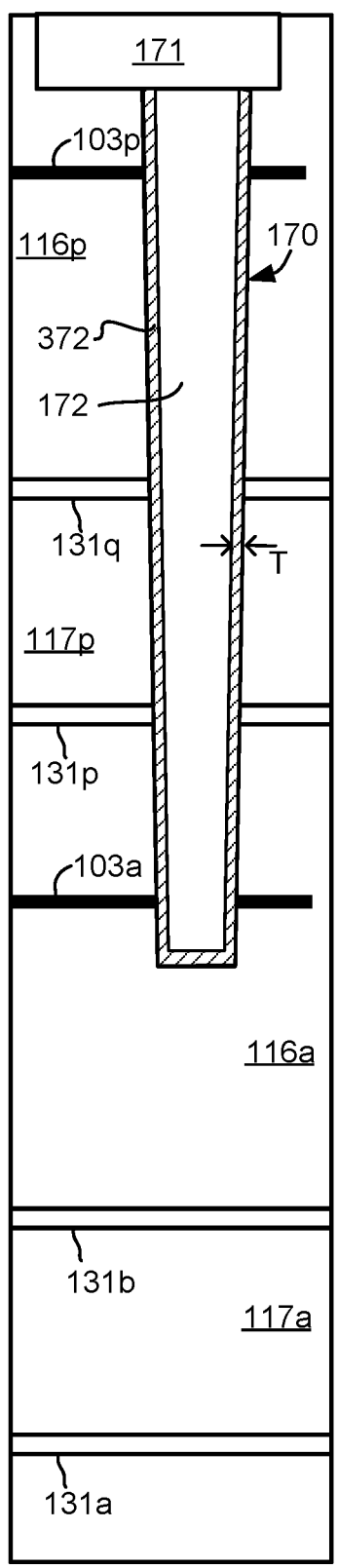
FIG. 3 illustrates a cross-sectional view of further detail of an interconnect feature of the IC of FIG. 1, in accordance with an embodiment of the present disclosure.

Although not illustrated in FIG. 1, in one embodiment, the interconnect feature 170 further comprises a barrier or liner layer on sidewalls and/or on bottom surface of the interconnect feature 170, as illustrated in FIG. 3. FIG. 3 illustrates further detail of the interconnect feature 170 of the IC 100 of FIG. 1, in accordance with an embodiment of the present disclosure. As illustrated in FIG. 3, in an example, the interconnect feature 170 comprises a barrier or liner layer 372 on sidewalls and/or on bottom surface of the interconnect feature 170. In an example, the barrier or liner layer 372 is conformally deposited, and hence, is also referred to herein as a conformal layer 372, or simply as layer 373.

In an example, a thickness of the conformal layer 372 is substantially constant along a length of the interconnect feature 170. In an example, the conformal layer 372 has a thickness T (see FIG. 3) in the range of 1 to 8 nanometers (nm), or 1 to 10 nm, or 0.5 to 20 nm, or 3 to 20 nm, or 3 to 30 nm. Suitable materials for the conformal layer 372 include barrier layer refractory metals and alloys, cobalt, cobalt-nickel (CoNi), ruthenium-cobalt combination, molybdenum, nickel, manganese, titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN).

In an example, the layer 372 prevents diffusion of the conductive material 172 (such as copper) to ILD material (such as ILD 116p, 117p, and/or 116a) adjacent to the interconnect feature 170. Furthermore, the layer 372 facilitates better adhesion of the conductive material 172 on walls of the interconnect feature 170. An electrical connection between the conductive material 172 of the interconnect feature 170 and the conductive structure 103p is through the conformal layer 372, and similarly, an electrical connection between the conductive material 172 of the interconnect feature 170 and the conductive structure 103a is through the conformal layer 372, in an example. Note that although FIG. 3 illustrates the conformal barrier or liner layer 372 separating the conductive material 172 from the adjacent ILDs, in one example, the conformal barrier or liner layer 372 may be absent from the interconnect feature 170.

In one embodiment, the interconnect feature 170 has a height-to-width aspect ratio of at least 7, or at least 8, or at least 10, or at least 12. A height of the interconnect feature 170 is in the range of 0.1 micron to 2 microns, e.g., in the range of 400 nm to 1200 nm, merely as an example, although other height range may also be possible. In one embodiment, the interconnect feature 170 has a slight tapered shape, where the lower section of the interconnect feature 170 is narrower (less horizontal width) than the upper section of the interconnect feature 170. In an example, the tapered shape is due to unintended technical limitations in forming a recess for the interconnect feature 170, as will be appreciated in light of this disclosure.

Figure 4:
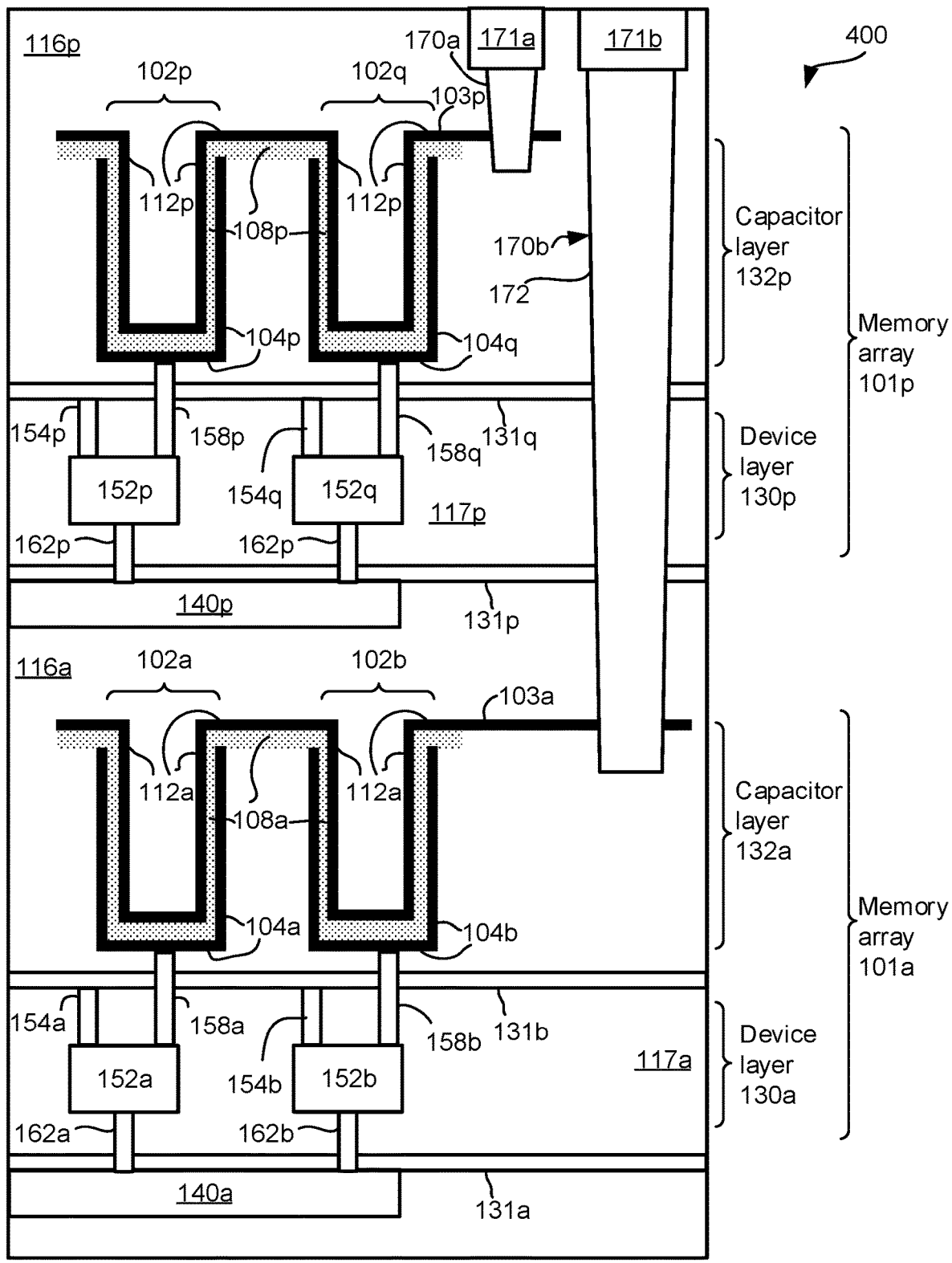
FIG. 4 illustrates a cross-sectional view of a section of an IC comprising (i) a first memory array and (ii) a second memory array above the first memory array, wherein individual memory cells of the first and second memory arrays comprise a corresponding transistor and a corresponding capacitor, wherein one or more capacitors of the first memory array have upper electrodes coupled to a first conductive structure, wherein one or more capacitors of the second memory array have upper electrodes coupled to a second conductive structure, wherein a first interconnect feature having a top surface above the second memory array is coupled to the second conductive structure, wherein a second interconnect feature having a top surface above the first memory array is coupled to the first conductive structure, and wherein each of the first and second interconnect features comprises a continuous and monolithic body of conductive material, in accordance with an embodiment of the present disclosure.

FIG. 4 illustrates a cross-sectional view of a section of an IC 400 comprising (i) a first memory array 101a and (ii) a second memory array 101p above the first memory array 101a, wherein individual memory cells 202 of the first and second memory arrays 101a, 101p comprise a corresponding transistor 152 and a corresponding capacitor 102, wherein one or more capacitors 102a, 102b of the first memory array 101a have upper electrodes 112a coupled to a first conductive structure 103a, wherein one or more capacitors 102p, 102q of the second memory array 101p have upper electrodes 112p coupled to a second conductive structure 103p, wherein a first interconnect feature 170a having a top surface above the second memory array 101p is coupled to the second conductive structure 103p, wherein a second interconnect feature 170b having a top surface above the first memory array 101p is coupled to the first conductive structure 103a, and wherein each of the first and second interconnect features 170a and 170b comprises a continuous and monolithic body of conductive material, in accordance with an embodiment of the present disclosure.

The IC 400 of FIG. 4 is at least in part similar to the IC 100 of FIG. 1, and similar components in the two ICs are labelled using same labels. However, in the IC 100 of FIG. 1, a single interconnect feature 170 extends through the conductive structures 103a, 103p. In contrast, in the IC 400 of FIG. 4, the interconnect feature 170a extends through the conductive structure 103p, and the interconnect feature 170b extends through the conductive structure 103a. Thus, the conductive structure 103a (and hence, the upper electrodes of the capacitors 102a, 102b) is coupled to outside circuits through the interconnect feature 170b, and another interconnect feature 171b above the interconnect feature 170b. Similarly, the conductive structure 103p (and hence, the upper electrodes of the capacitors 102p, 102q) is coupled to outside circuits through the interconnect feature 170a and another interconnect feature 171a above the interconnect feature 170a. Discussions of the IC 100 with respect to FIGS. 1-3 are also applicable to the IC 500 of FIG. 4.

Figure 5:
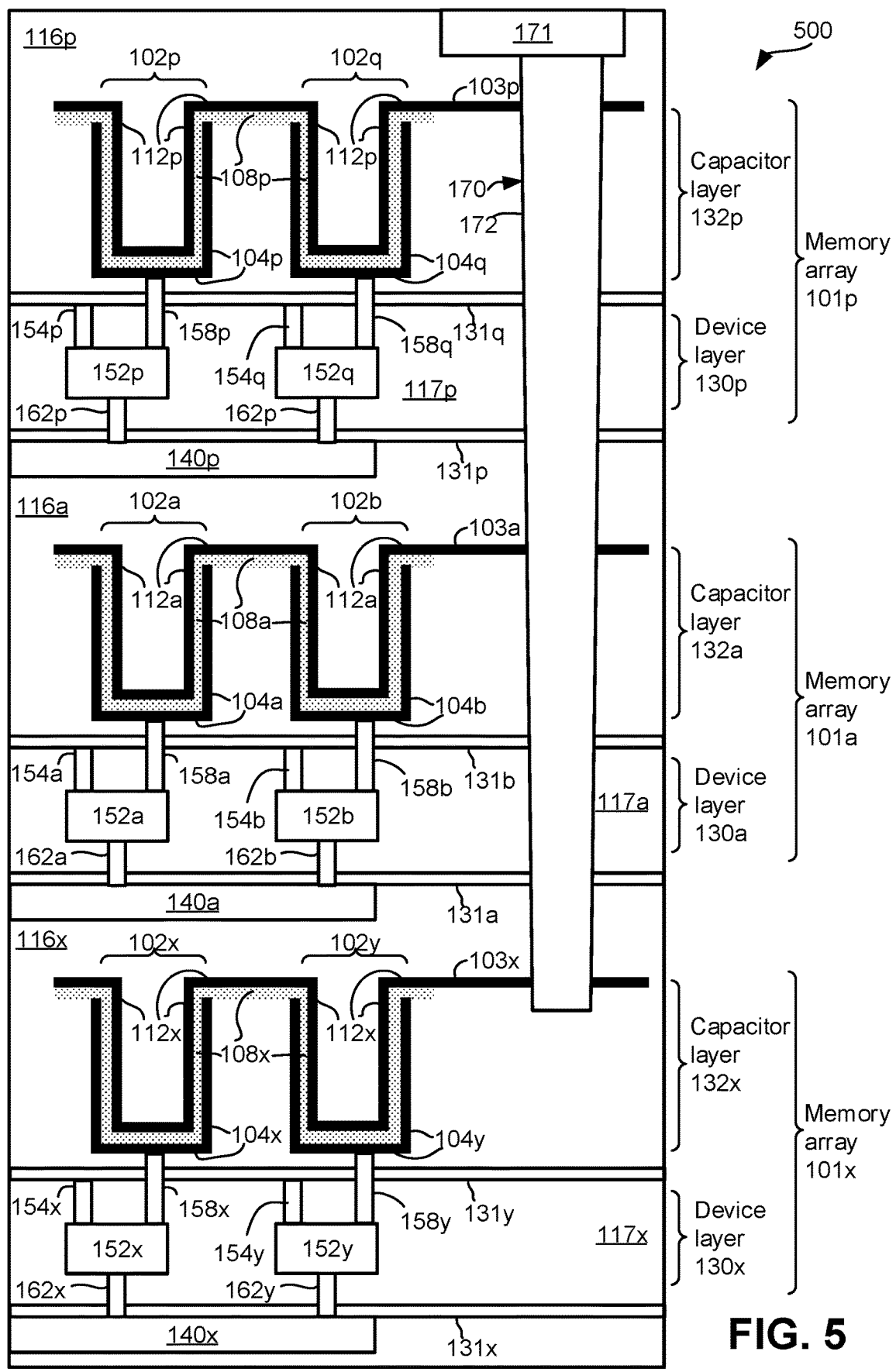
FIG. 5 illustrates a cross-sectional view of a section of an IC comprising (i) a first memory array, (ii) a second memory array above the first memory array, and (iii) a third memory array below the first memory array, wherein individual memory cells of each of the memory arrays comprise a corresponding transistor and a corresponding capacitor, wherein one or more capacitors of the first memory array have upper electrodes coupled to a first conductive structure, wherein one or more capacitors of the second memory array have upper electrodes coupled to a second conductive structure, wherein one or more capacitors of the third memory array have upper electrodes coupled to a third conductive structure, wherein an interconnect feature having a top surface above the second memory array extends through and is electrically coupled to the first, second, and third conductive structures, and wherein the interconnect feature comprises a continuous and monolithic body of conductive material, in accordance with an embodiment of the present disclosure.

FIG. 5 illustrates a cross-sectional view of a section of an IC 500 comprising (i) a first memory array 101a, (ii) a second memory array 101p above the first memory array 101a, and (iii) a third memory array 101x below the first memory array 101a, wherein individual memory cells of each of the memory arrays comprise a corresponding transistor 152 and a corresponding capacitor 102, wherein one or more capacitors 102a, 102b of the first memory array 101a have upper electrodes 112a coupled to a first conductive structure 103a, wherein one or more capacitors 102p, 102q of the second memory array 101p have upper electrodes 112p coupled to a second conductive structure 103p, wherein one or more capacitors 102x, 102y of the third memory array 101x have upper electrodes 112x coupled to a third conductive structure 103x, wherein an interconnect feature 170 having a top surface above the second memory array 101p extends through and is electrically coupled to the first, second, and third conductive structures 103a, 103p, and 103x, and wherein the interconnect feature 170 comprises a continuous and monolithic body of conductive material, in accordance with an embodiment of the present disclosure.

Comparing the IC 100 of FIG. 1 and the IC 500 of FIG. 5, the IC 100 has two stacked memory arrays 101a, 101p. In contrast, the IC 500 of FIG. 5 has three stacked memory arrays 101x, 101a, 101p. In an example, the memory array 101x is similar to the memory arrays 101a, 101p. For example, the memory array 101x includes (i) a device layer 130x comprising transistors 152x, 152y, and (ii) a capacitor layer 132x comprising capacitors 102x, 102y, each of which is coupled to a corresponding transistor, as illustrated. Structures of the capacitors and the transistors of the memory array 101x are similar to those of the other two memory arrays 101a, 101p. Upper electrodes 112x of the capacitors 102x, 102y are coupled to the conductive structure 103x.

As illustrated in FIG. 5, the interconnect feature 170 extends through, and is conductively coupled to, the conductive structure 103x. Thus, the same interconnect feature 170 may be used to conductively couple upper electrodes of three memory arrays 101x, 101a, and 101p, as illustrated in FIG. 5. Discussions of the IC 100 with respect to FIGS. 1-3 are also applicable to the IC 500 of FIG. 5.

Figure 6:
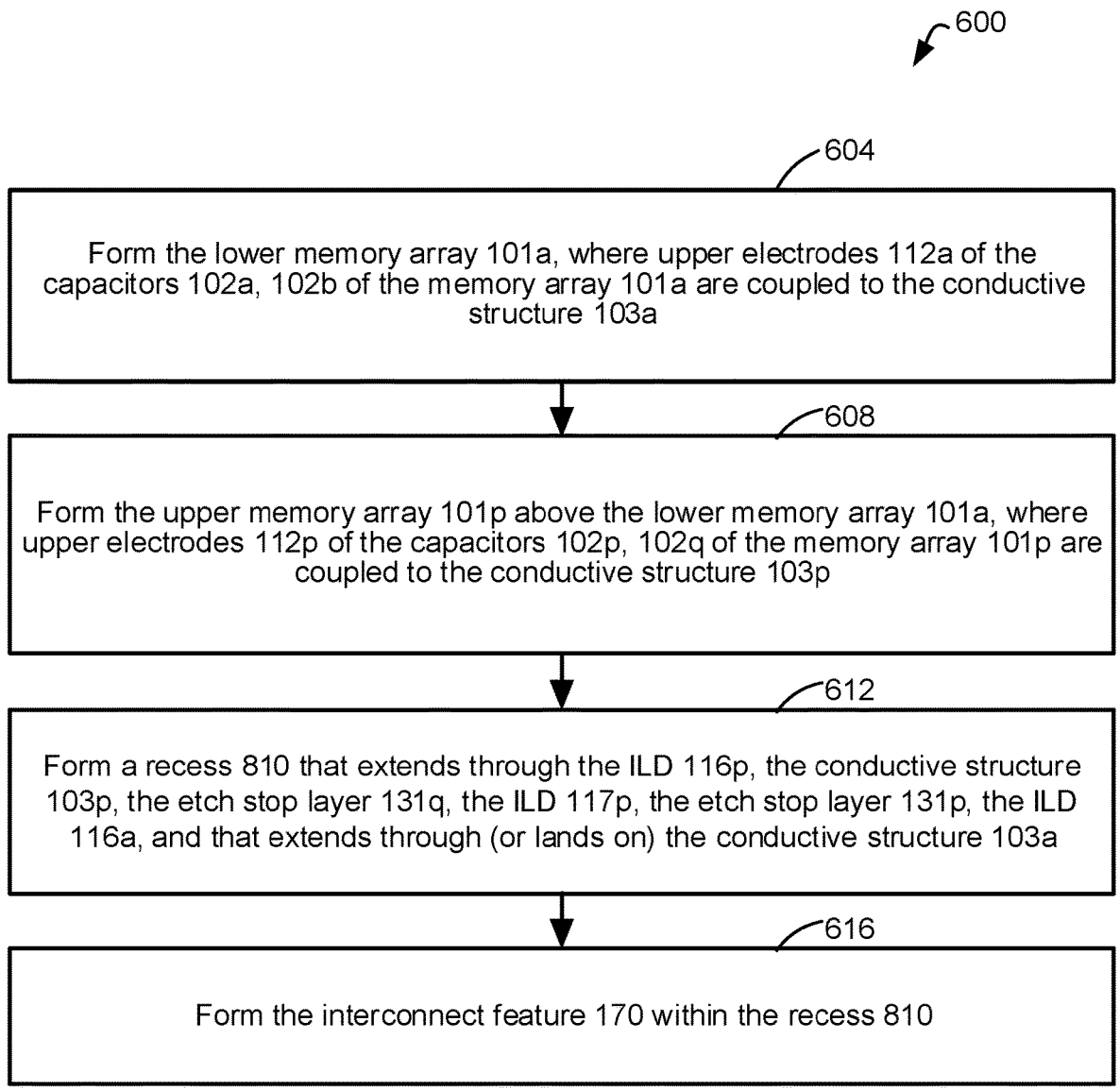
FIG. 6 illustrates a flowchart depicting a method of forming an IC (such as the IC of FIG. 1) comprising (i) a first memory array and (ii) a second memory array above the first memory array, wherein individual memory cells of the first and second memory arrays comprise a corresponding transistor and a corresponding capacitor, wherein one or more capacitors of the first memory array have upper electrodes coupled to a first conductive structure, wherein one or more capacitors of the second memory array have upper electrodes coupled to a second conductive structure, and wherein an interconnect feature extends through the second conductive structure and extends through the first conductive structure, and wherein the interconnect feature comprises a continuous and monolithic body of conductive material, in accordance with an embodiment of the present disclosure.

FIG. 6 illustrates a flowchart depicting a method 600 of forming an IC (such as the IC 100 of FIG. 1) comprising (i) a first memory array 101a and (ii) a second memory array 101p above the first memory array 101a, wherein individual memory cells 202 of the first and second memory arrays 101a, 101p comprise a corresponding transistor 152 and a corresponding capacitor 102, wherein one or more capacitors 102a, 102b of the first memory array 101a have upper electrodes 112a coupled to a first conductive structure 103a, wherein one or more capacitors 102p, 102q of the second memory array 101p have upper electrodes 112p coupled to a second conductive structure 103p, and wherein an interconnect feature 170 extends through the second conductive structure 103p and extends through the first conductive structure 103a, and wherein the interconnect feature 170 comprises a continuous and monolithic body of conductive material, in accordance with an embodiment of the present disclosure. FIGS. 7A-7D illustrate cross-sectional views of an IC (such as the IC 100 of FIG. 1) in various stages of processing, in accordance with an embodiment of the present disclosure. FIGS. 6 and 7A-7D will be discussed in unison.

Figure 7A:
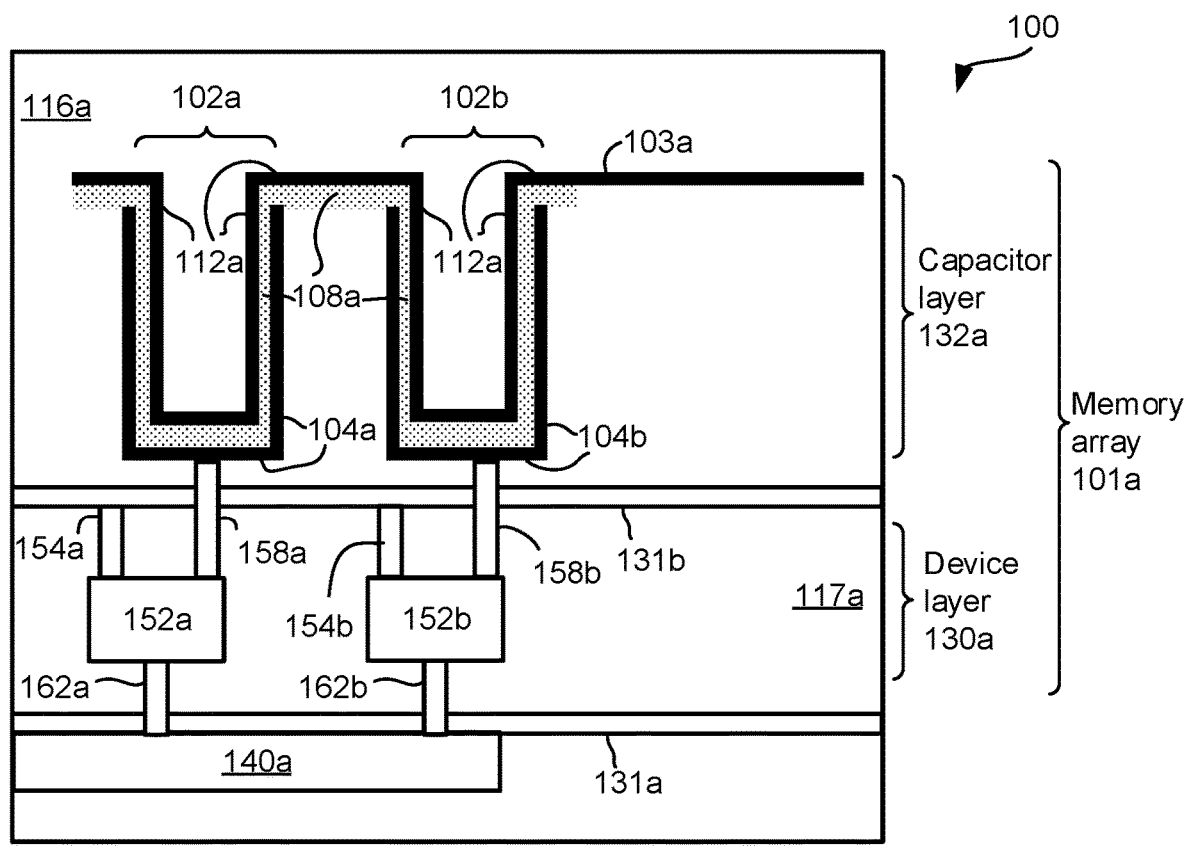
FIGS. 7A-7D illustrate cross-sectional views of an IC (such as the IC of FIG. 1) in various stages of processing, in accordance with an embodiment of the present disclosure.

Referring to FIG. 6, the method 600 includes, at 604, forming the lower memory array 101a. For example, the memory array 101a includes (i) the device layer 130a comprising the transistors 152a, 152b, and (ii) the capacitor layer 132a comprising the capacitors 102a, 102b respectively coupled to the transistors 152a, 152b, as illustrated in FIG. 7A. As discussed with respect to FIG. 1 and as also illustrated in FIG. 7A, upper electrodes 112a of the capacitors 102a, 102b of the memory array 101a are coupled to the conductive structure 103a. The memory array 101a may be formed using any appropriate techniques used to form memory arrays.

Figure 7B:
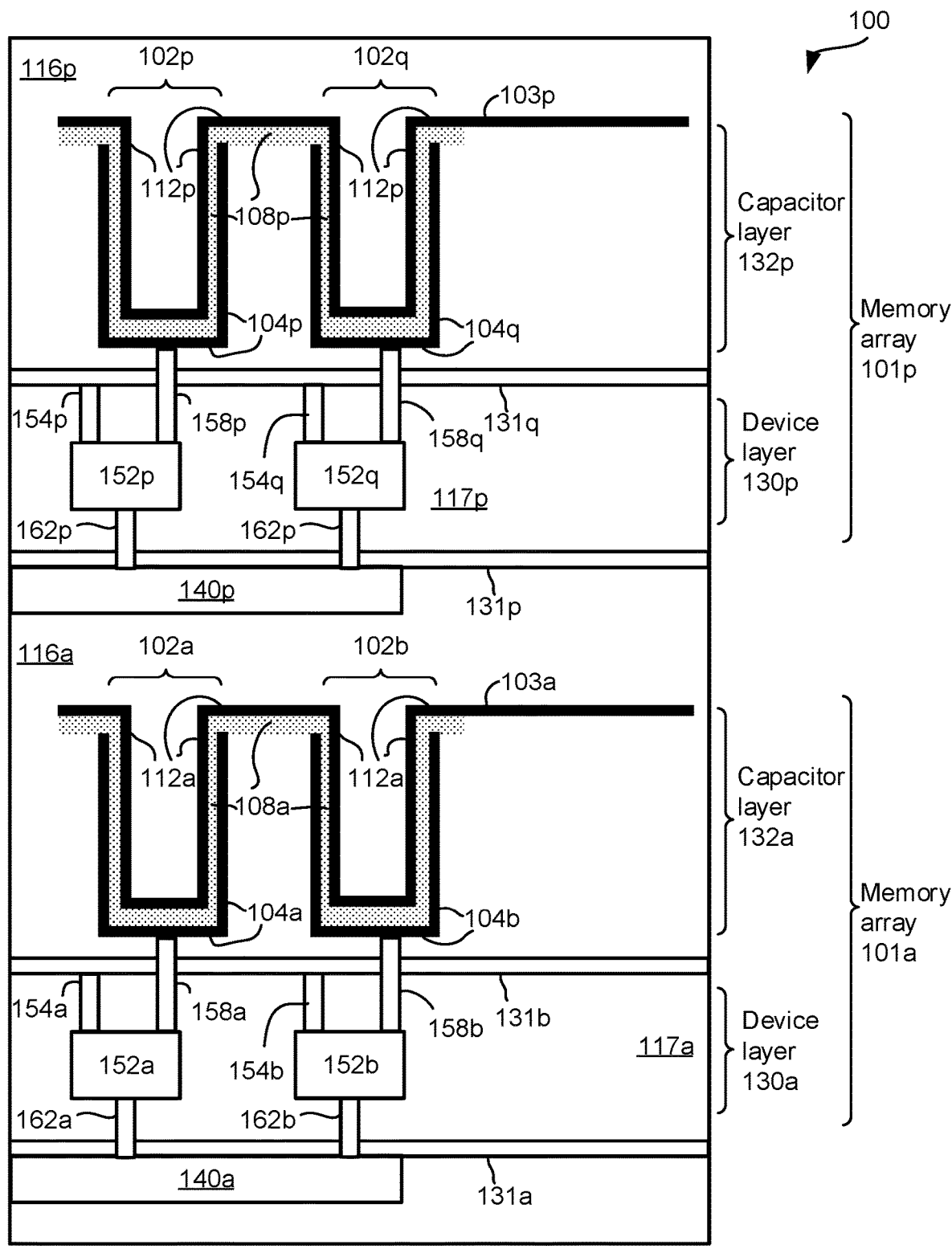

Referring again to FIG. 6, the method 600 then proceeds from 604 to 608, where the upper memory array 101p is formed above the lower memory array 101a, as illustrated in FIG. 7B. For example, as discussed with respect to FIG. 1 and as also illustrated in FIG. 7B, the upper memory array 101p includes (i) the device layer 130p comprising the transistors 152p, 152q and (ii) the capacitor layer 132p comprising the capacitors 102p, 102q respectively coupled to the transistors 152p, 152q. The upper electrodes 112p of the capacitors 102p, 102q of the memory array 101p are coupled to the conductive structure 103p. The memory array 101p may be formed using any appropriate techniques used to form memory arrays.

Figure 7C:
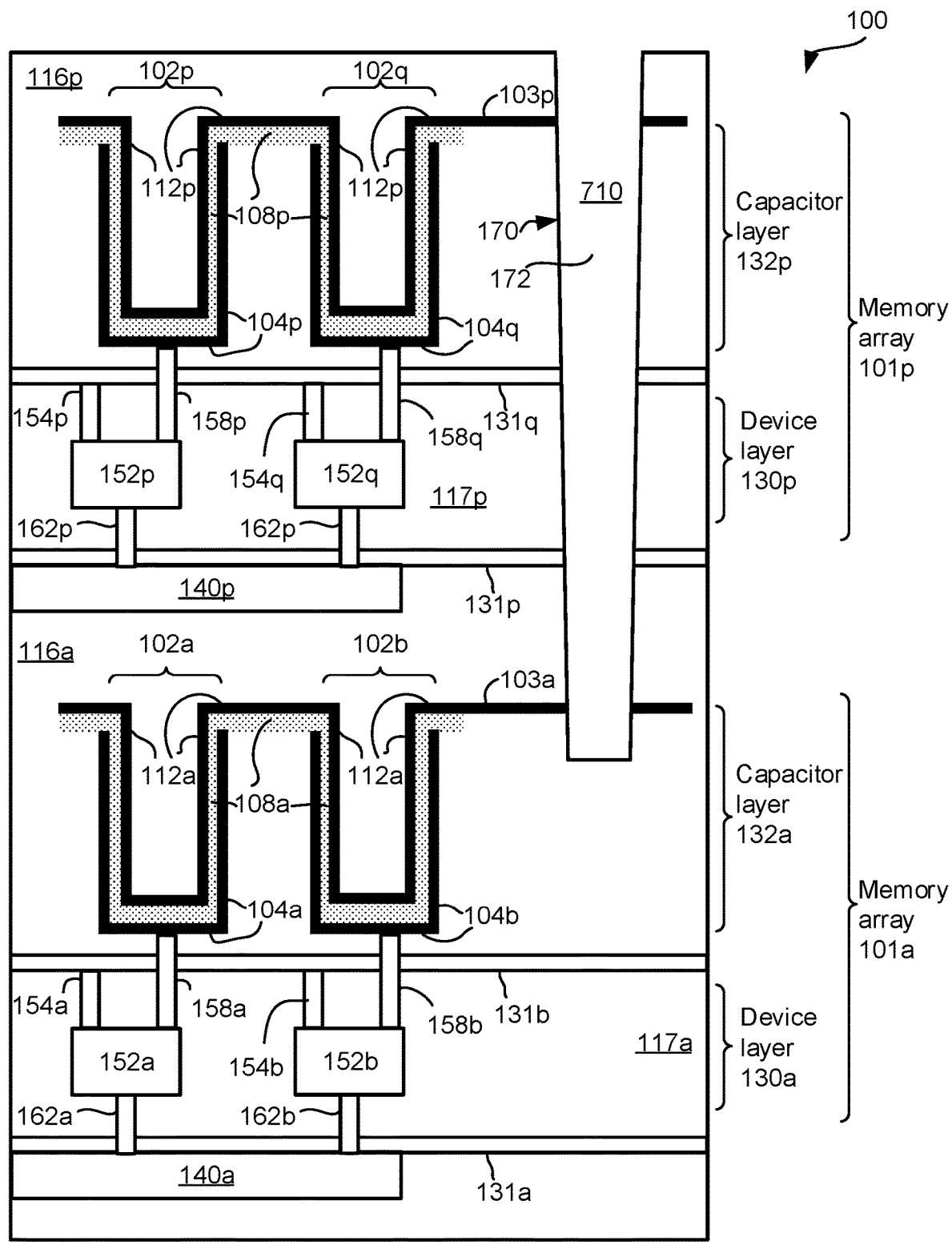

Referring again to FIG. 6, the method 600 then proceeds from 608 to 612, where a recess 710 is formed, as illustrated in FIG. 7C. The recess 710 extends through the ILD 116p, the conductive structure 103p, the etch stop layer 131q, the ILD 117p, the etch stop layer 131p, and at least in part through the ILD 116a. In an example and as illustrated in FIG. 7C, the recess 710 extends through the conductive structure 103a. Thus, the recess 710, which may be a via, extends through or "punches through" (e.g., cuts through) the conductive structures 103a and 103p. In an example, the recess 710 may be formed using a patterned mask on the ILD 116p and etching through an opening within the mask using an appropriate anisotropic etching technique.

Figure 7D:
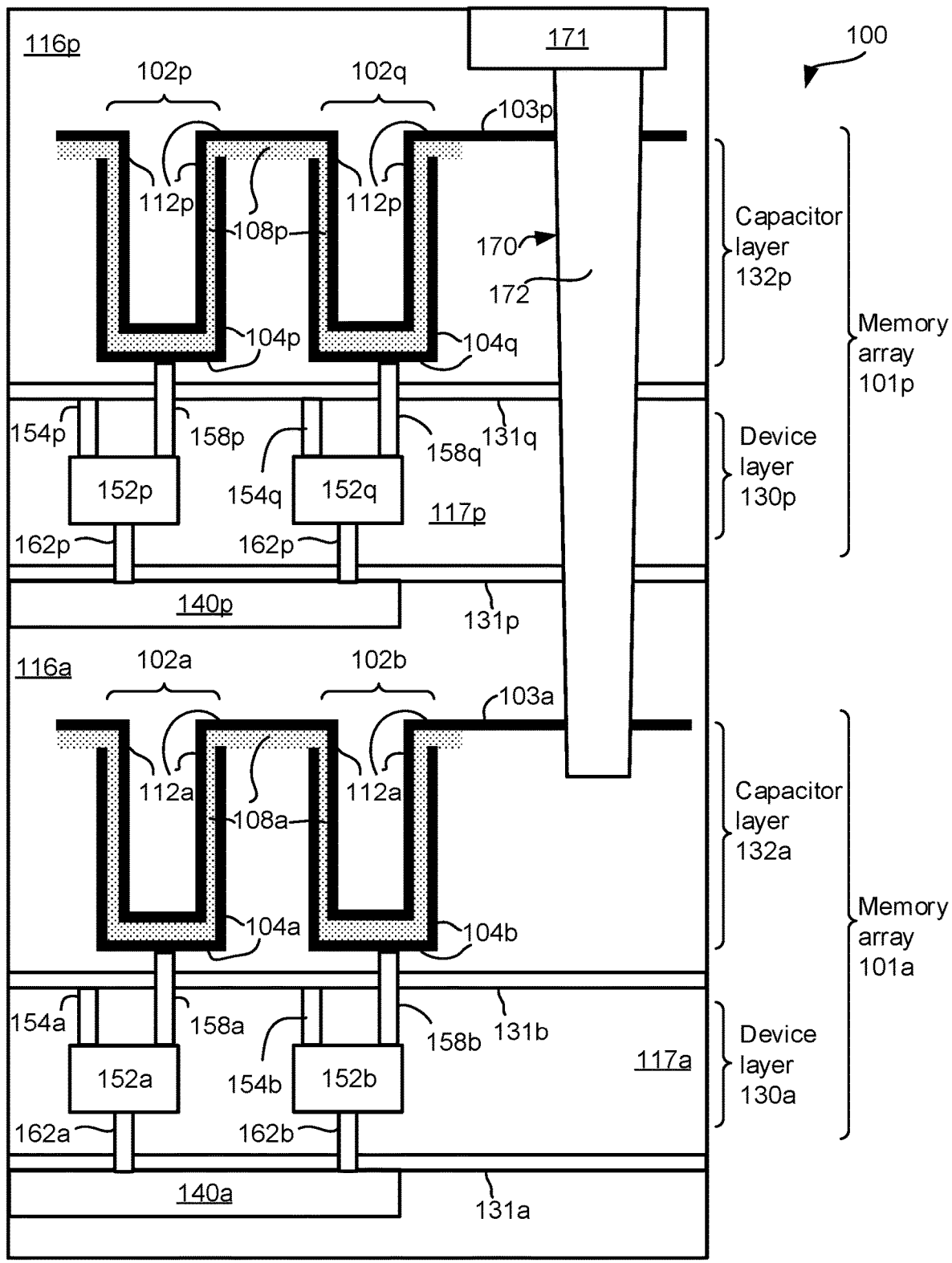

Referring again to FIG. 6, the method 600 then proceeds from 608 to 616, where the interconnect feature 170 is formed within the recess 710, as illustrated in FIG. 7D. Forming the interconnect feature 170 comprises depositing (e.g., conformally depositing) the layer 372 (see FIG. 3) on sidewalls and bottom surface of the recess 710 using any suitable deposition technique, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. As discussed, the conformal layer 372 acts as a barrier or liner layer. Note that although FIG. 3 illustrates the layer 372, FIG. 7D does not illustrate the layer 372 for purposes of illustrative clarity. In another example, the layer 373 may not be deposited within the recess 710.

Subsequently, conductive material 172 is deposited within the recess 710 that is lined by the layer 373, where the conductive material 172 is deposited using any suitable deposition technique, such as CVD, PVD, ALD, VPE, MBE, LPE, or electroplating, for example. In an example, the conductive material 172 of the interconnect feature 170 is deposited during a single deposition process. Accordingly, the interconnect feature 170 comprises a continuous and monolithic body of conductive material 172 that extends from a top surface of the interconnect feature 170 to the bottom surface of the interconnect feature 170. In an example, the continuous and monolithic body of conductive material 172 of the interconnect feature 170 at least extends through the conductive structure 103p to the conductive structure 103a. For example, there is no seam, interface, liner or barrier layer between a section of the interconnect feature 170 in contact with the conductive structure 103p and another section of the interconnect feature 170 in contact with the conductive structure 103a. Rather, the entire body of conductive material 172 of the interconnect feature 170 is continuous and monolithic, in one example.

Subsequent to formation of the interconnect feature 170, the interconnect feature 171 may be formed above, and conductive coupled to, the interconnect feature 170, as illustrated in FIG. 7D. The IC 100 of FIG. 7D is similar to the IC 100 of FIG. 1.

As the recess 710 punches through the conductive structure 103p and also punches through the conductive structure 103a, the resulting interconnect feature 170 also correspondingly extends through the conductive structure 103p and also extends through the conductive structure 103a, as illustrated in FIGS. 1 and 7D. Thus, as the interconnect feature 170 punches through or cuts through one or both of the conductive structures 103p, 103a, the interconnect feature 170 is also referred to herein as a punch-through interconnect feature.

Note that the processes in method 600 are shown in a particular order for ease of description. However, one or more of the processes may be performed in a different order or may not be performed at all (and thus be optional), in accordance with some embodiments. Numerous variations on method 600 and the techniques described herein will be apparent in light of this disclosure.

Example System

Figure 8:
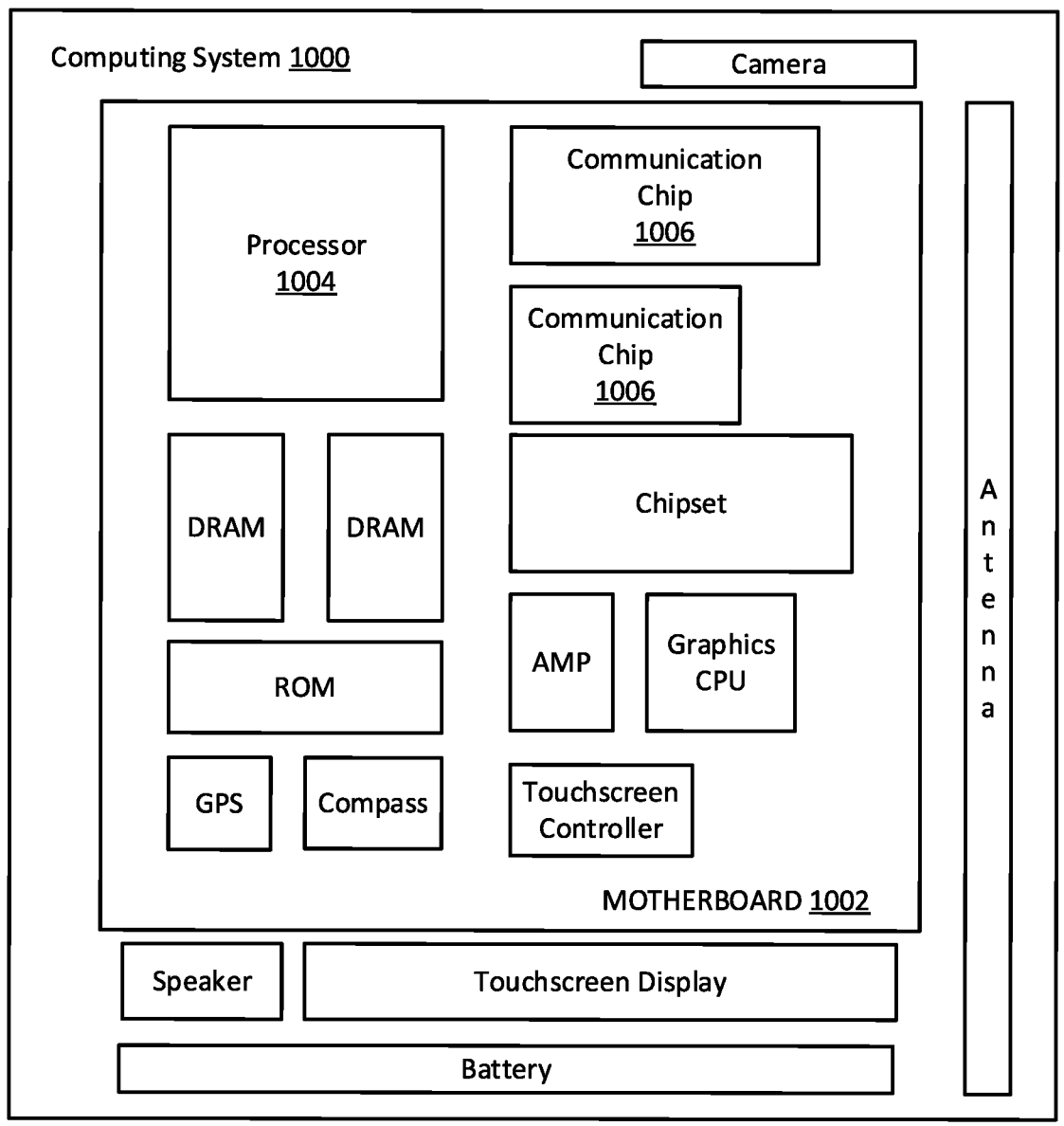
FIG. 8 illustrates a computing system implemented with integrated circuit structures having one or more memory arrays formed using the techniques disclosed herein, in accordance with some embodiments of the present disclosure.

FIG. 8 illustrates a computing system 1000 implemented with integrated circuit structures having one or more memory arrays formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit comprising: a first memory cell including (i) a first transistor and (ii) a first capacitor coupled to the first transistor, and where an upper electrode of the first capacitor is coupled to a first conductive structure; a second memory cell above the first memory cell, the second memory cell including (i) a second transistor and (ii) a second capacitor coupled to the second transistor, and where an upper electrode of the second capacitor is coupled to a second conductive structure; and an interconnect feature comprising a continuous and monolithic body of conductive material, the continuous and monolithic body extending through the second conductive structure, and further extending through the first conductive structure.

Example 2. The integrated circuit of example 1, wherein the interconnect feature further comprises a continuous conformal layer on one or more sidewalls of the interconnect feature, where the continuous conformal layer extends through the first conductive structure to at least the second conductive structure.

Example 3. The integrated circuit of example 2, wherein the continuous conformal layer comprises one or more of cobalt, nickel, ruthenium, molybdenum, manganese, titanium, tungsten, tantalum, silicon, or nitrogen.

Example 4. The integrated circuit of any one of examples 2-3, wherein the continuous conformal layer is a barrier or liner layer that reduces diffusion of the conductive material of the interconnect feature to adjacent dielectric material, and/or that facilitates adhesion of the conductive material on sidewalls walls of the interconnect feature.

Example 5. The integrated circuit of any one of examples 1-4, wherein a top surface of the interconnect feature, including a top surface of the continuous and monolithic body of conductive material, is above the second capacitor.

Example 6. The integrated circuit of any one of examples 1-5, wherein a bottom surface of the interconnect feature, including a bottom surface of the continuous and monolithic body of conductive material, is below the second transistor.

Example 7. The integrated circuit of any one of examples 1-7, wherein a lower electrode of the first capacitor is coupled to a drain terminal of the first transistor, and wherein a lower electrode of the second capacitor is coupled to a drain terminal of the second transistor.

Example 8. The integrated circuit of any one of examples 1-7, wherein each of the first and second capacitors is a metal-insulator-metal (MIM) capacitor comprising a corresponding upper electrode, a corresponding lower electrode, and one or more corresponding layers of dielectric material between the upper and lower electrodes.

Example 9. The integrated circuit of example 8, wherein the one or more corresponding layers of dielectric material between the upper and lower electrodes includes one layer comprising a metal and oxygen.

Example 10. The integrated circuit of example 9, wherein the metal is one of hafnium, aluminum, zirconium, titanium, or tantalum.

Example 11. The integrated circuit of any one of examples 8-10, wherein one or both of the upper and lower electrodes of the one or both of the first and second capacitors comprise a metal or an alloy thereof.

Example 12. The integrated circuit of any one of examples 1-11, wherein the interconnect feature extends through a punch-through hole within the second conductive structure.

Example 13. The integrated circuit of any one of examples 1-12, wherein the first capacitor is above the first transistor, the second transistor is above the first capacitor, and the second capacitor is above the second transistor.

Example 14. The integrated circuit of any one of examples 1-13, wherein: the integrated circuit includes (i) a first memory array comprising a first plurality of memory cells that includes the first memory cell, and (ii) a second memory array comprising a second plurality of memory cells that includes the second memory cell; the second memory array is above the first memory array; each of the first plurality of memory cells comprises a corresponding capacitor and a corresponding transistor, wherein upper electrodes of one or more capacitors of corresponding one or more of the first plurality of memory cells are coupled to the first conductive structure; and each of the second plurality of memory cells comprises a corresponding capacitor and a corresponding transistor, wherein upper electrodes of one or more capacitors of corresponding one or more of the second plurality of memory cells are coupled to the second conductive structure.

Example 15. The integrated circuit of any one of examples 1-14, further comprising: a third memory cell above the second memory cell, the third memory cell including (i) a third transistor and (ii) a third capacitor coupled to the third transistor, and where an upper electrode of the third capacitor is coupled to a third conductive structure, wherein the continuous and monolithic body of the interconnect feature extends through the third conductive structure.

Example 16. The integrated circuit of any one of examples 1-15, wherein the continuous and monolithic body of conductive material comprises one or more of copper, ruthenium, molybdenum, tungsten, aluminum, tin, indium, antimony, bismuth, or rhenium.

Example 17. The integrated circuit of any one of examples 1-16, wherein the integrated circuit is a memory device.

Example 18. An integrated circuit device comprising: a device layer comprising a plurality of transistors; a first conductive structure coupled to a first plurality of capacitors that are above the device layer; a second conductive structure coupled to a second plurality of capacitors that are below the device layer; and an interconnect feature having a top surface above the first conductive structure, wherein the interconnect feature extends through the second conductive structure, and wherein the interconnect feature comprises a monolithic body of conductive material extending from the top surface of the interconnect feature to the second conductive structure.

Example 19. The integrated circuit device of example 18, wherein the interconnect feature further comprises a continuous layer on one or more sidewalls of the interconnect feature, where the continuous layer extends from the top surface of the interconnect feature to the second conductive structure.

Example 20. The integrated circuit device of example 19, wherein the continuous layer comprises one or more of cobalt, nickel, ruthenium, molybdenum, manganese, titanium, tungsten, tantalum, silicon, or nitrogen.

Example 21. The integrated circuit device of any one of examples 18-20, wherein the device layer is a first device layer, wherein the plurality of transistors is a first plurality of transistors, and wherein the integrated circuit device further comprises: a second device layer below the second plurality of capacitors, the second device layer comprising a second plurality of transistors, wherein an individual capacitor of the second plurality of capacitors is coupled to a corresponding transistor of the second plurality of transistors.

Example 22. The integrated circuit device of example 21, wherein the individual capacitor of the second plurality of capacitors is coupled to a drain terminal of the corresponding transistor of the second plurality of transistors.

Example 23. The integrated circuit device of any one of examples 21-22, wherein the individual capacitor of the second plurality of capacitors and the corresponding transistor of the second plurality of transistors form a memory cell.

Example 24. The integrated circuit device of any one of examples 18-23, wherein an individual capacitor of the first plurality of capacitors is coupled to a corresponding transistor of the plurality of transistors.

Example 25. The integrated circuit device of example 24, wherein the individual capacitor of the first plurality of capacitors and the corresponding transistor of the plurality of transistors form a memory cell.

Example 26. The integrated circuit device of example 25, wherein the memory cell is a dynamic random access memory (DRAM) memory cell.

Example 27. The integrated circuit device of any one of examples 25-26, wherein the top surface of the interconnect feature is above the device layer, and a bottom surface of the interconnect feature is below the device layer.

Example 28. The integrated circuit device of any one of examples 18-27, wherein the monolithic body of conductive material extends through, and is conductively coupled to, the first conductive structure.

Example 29. The integrated circuit device of any one of examples 18-28, wherein the monolithic body of conductive material extends through, and is conductively coupled to, the second conductive structure.

Example 30. The integrated circuit device of any one of examples 18-29, wherein the monolithic body of conductive material is conductively coupled to, the second conductive structure.

Example 31. An integrated circuit (IC) comprising: a first layer comprising a first plurality of transistors; a second layer above the first layer, the second layer comprising a first plurality of capacitors, wherein an individual capacitor of the first plurality of capacitors is coupled to a corresponding transistor of the first plurality of transistors, and wherein an upper electrode of one or more capacitors of the first plurality of capacitors is coupled to a first conductive structure comprising conductive material; a third layer above the second layer, the third layer comprising a second plurality of transistors; a fourth layer above the third layer, the fourth layer comprising a second plurality of capacitors, wherein an individual capacitor of the second plurality of capacitors is coupled to a corresponding transistor of the second plurality of transistors, and wherein an upper electrode of one or more capacitors of the second plurality of capacitors is coupled to a second conductive structure comprising conductive material; and an interconnect feature extending through the fourth layer, the second conductive structure, the third layer, and the first conductive structure.

Example 32. The integrated circuit device of example 31, wherein the interconnect feature comprises a continuous and monolithic body of conductive material that extends through the second conductive structure to at least the first conductive structure.

Example 33. The integrated circuit device of any one of examples 31-32, wherein the interconnect feature comprises a continuous layer on one or more sidewalls of the interconnect feature, where the continuous layer extends through the second conductive structure to at least the first conductive structure.

Example 34. The integrated circuit device of any one of examples 31-33, wherein the second interconnect feature is within or above the fourth layer.

Example 35. The integrated circuit device of any one of examples 31-34, wherein the first interconnect feature is within or above the second layer.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a first memory cell including (i) a first transistor and (ii) a first capacitor coupled to the first transistor, and where an upper electrode of the first capacitor is coupled to a first conductive structure;
   a second memory cell above the first memory cell, the second memory cell including (i) a second transistor and (ii) a second capacitor coupled to the second transistor, and where an upper electrode of the second capacitor is coupled to a second conductive structure; and
   an interconnect feature being a continuous and monolithic body of conductive material, the continuous and monolithic body extending through the second conductive structure, and further extending through the first conductive structure.

2. The integrated circuit of claim 1, wherein the interconnect feature further comprises a continuous conformal layer on one or more sidewalls of the interconnect feature, where the continuous conformal layer extends through the first conductive structure to at least the second conductive structure.

3. The integrated circuit of claim 2, wherein the continuous conformal layer comprises one or more of cobalt, nickel, ruthenium, molybdenum, manganese, titanium, tungsten, tantalum, silicon, or nitrogen.

4. The integrated circuit of claim 1, wherein a top surface of the interconnect feature is above the second capacitor.

5. The integrated circuit of claim 1, wherein a bottom surface of the interconnect feature is below the second transistor.

6. The integrated circuit of claim 1, wherein a lower electrode of the first capacitor is coupled to a drain terminal of the first transistor, and wherein a lower electrode of the second capacitor is coupled to a drain terminal of the second transistor.

7. The integrated circuit of claim 1, wherein each of the first and second capacitors is a metal-insulator-metal (MIM) capacitor comprising a corresponding upper electrode, a corresponding lower electrode, and one or more corresponding layers of dielectric material between the upper and lower electrodes.

8. The integrated circuit of claim 7, wherein the one or more corresponding layers of dielectric material between the upper and lower electrodes includes one layer comprising a metal and oxygen.

9. The integrated circuit of claim 1, wherein the first capacitor is above the first transistor, the second transistor is above the first capacitor, and the second capacitor is above the second transistor.

10. The integrated circuit of claim 1, wherein:
    the integrated circuit includes (i) a first memory array comprising a first plurality of memory cells that includes the first memory cell, and (ii) a second memory array comprising a second plurality of memory cells that includes the second memory cell;
    the second memory array is above the first memory array;
    each of the first plurality of memory cells comprises a corresponding capacitor and a corresponding transistor, wherein upper electrodes of one or more capacitors of corresponding one or more of the first plurality of memory cells are coupled to the first conductive structure; and
    each of the second plurality of memory cells comprises a corresponding capacitor and a corresponding transistor, wherein upper electrodes of one or more capacitors of corresponding one or more of the second plurality of memory cells are coupled to the second conductive structure.

11. The integrated circuit of claim 1, further comprising:
    a third memory cell above the second memory cell, the third memory cell including (i) a third transistor and (ii) a third capacitor coupled to the third transistor, and where an upper electrode of the third capacitor is coupled to a third conductive structure,
    wherein the continuous and monolithic body of the interconnect feature extends through the third conductive structure.

12. The integrated circuit of claim 1, wherein the continuous and monolithic body of conductive material comprises one or more of copper, ruthenium, molybdenum, tungsten, aluminum, tin, indium, antimony, bismuth, or rhenium.

13. An integrated circuit device comprising:
    a device layer comprising a plurality of transistors;
    a first conductive structure coupled to a first plurality of capacitors that are above the device layer;
    a second conductive structure coupled to a second plurality of capacitors that are below the device layer; and
    an interconnect feature being a continuous and monolithic body of conductive material and having a top surface above the first conductive structure, wherein the interconnect feature extends through the second conductive structure.

14. The integrated circuit device of claim 13, wherein the interconnect feature further comprises a continuous layer on one or more sidewalls of the interconnect feature, where the continuous layer extends from the top surface of the interconnect feature to the second conductive structure.

15. The integrated circuit device of claim 13, wherein the device layer is a first device layer, wherein the plurality of transistors is a first plurality of transistors, and wherein the integrated circuit device further comprises:
    a second device layer below the second plurality of capacitors, the second device layer comprising a second plurality of transistors,
    wherein an individual capacitor of the second plurality of capacitors is coupled to a corresponding transistor of the second plurality of transistors.

16. The integrated circuit device of claim 13, wherein an individual capacitor of the first plurality of capacitors is coupled to a corresponding transistor of the plurality of transistors.

17. The integrated circuit device of claim 13, wherein the monolithic body of conductive material extends through, and is conductively coupled to, the first conductive structure.

18. An integrated circuit (IC) comprising:
    a first layer comprising a first plurality of transistors;
    a second layer above the first layer, the second layer comprising a first plurality of capacitors, wherein an individual capacitor of the first plurality of capacitors is coupled to a corresponding transistor of the first plurality of transistors, and wherein an upper electrode of one or more capacitors of the first plurality of capacitors is coupled to a first conductive structure comprising conductive material;

a third layer above the second layer, the third layer comprising a second plurality of transistors;

a fourth layer above the third layer, the fourth layer comprising a second plurality of capacitors, wherein an individual capacitor of the second plurality of capacitors is coupled to a corresponding transistor of the second plurality of transistors, and wherein an upper electrode of one or more capacitors of the second plurality of capacitors is coupled to a second conductive structure comprising conductive material; and an interconnect feature being a continuous and monolithic body of conductive material that extends through at least the second conductive structure and the first conductive structure.

19. The integrated circuit of claim 18, wherein the interconnect feature extends through the third layer and the fourth layer.

20. The integrated circuit of claim 18, wherein the interconnect feature comprises a continuous layer on one or more sidewalls of the interconnect feature, where the continuous layer extends through the second conductive structure to at least the first conductive structure.

* * * * *